US010649023B2

(12) United States Patent
Harteneck

(10) Patent No.: US 10,649,023 B2
(45) Date of Patent: May 12, 2020

(54) RADIO TEST SYSTEM AND METHOD FOR TESTING A DEVICE UNDER TEST

(71) Applicant: Rohde & Schwarz GmbH & Co. KG, Munich (DE)

(72) Inventor: Moritz Harteneck, Munich (DE)

(73) Assignee: Rohde & Schwarz GmBH & Co. KG, Munich (DE)

(*) Notice: Subject to any disclaimer, the term of this patent is extended or adjusted under 35 U.S.C. 154(b) by 83 days.

(21) Appl. No.: 15/970,089

(22) Filed: May 3, 2018

(65) Prior Publication Data
US 2018/0321301 A1 Nov. 8, 2018

(30) Foreign Application Priority Data
May 4, 2017 (EP) .................................... 17169533

(51) Int. Cl.
G01R 31/02 (2006.01)
G01R 31/28 (2006.01)
(Continued)

(52) U.S. Cl.
CPC ... G01R 31/2822 (2013.01); G01R 31/31926 (2013.01); G01V 3/083 (2013.01);
(Continued)

(58) Field of Classification Search
CPC . G01V 3/083; G01V 3/12; G01V 3/02; G01V 3/24; Y02A 90/344; Y02A 90/342; Y02A 90/32
(Continued)

(56) References Cited

U.S. PATENT DOCUMENTS

| 2007/0201536 | A1 | 8/2007 | Nicolas et al. |
| 2012/0100813 | A1* | 4/2012 | Mow ...................... H04B 17/12 |
| | | | 455/67.12 |

(Continued)

FOREIGN PATENT DOCUMENTS

| WO | 2013/004887 A1 | 1/2013 |
| WO | 2016/190944 A1 | 12/2016 |

OTHER PUBLICATIONS

Extended European Search Report dated Oct. 24, 2017, issued in priority European Application No. 17169533.1 filed May 4, 2017, 12 pages.

Primary Examiner — Giovanni Astacio-Oquendo
Assistant Examiner — Raul J Rios Russo
(74) Attorney, Agent, or Firm — Christensen O'Connor Johnson Kindness PLLC

(57) ABSTRACT

A radio test system for testing a device under test is described, comprising a signal generation unit configured to generate a downlink signal to be transmitted to the device under test for over-the-air testing. The radio test system has at least one antenna configured to transmit the downlink signal via an over-the-air transmission channel to the device under test. Further, a receiver is provided that is configured to receive a response signal via the over-the-air transmission channel from the device under test. In addition, the radio test system has at least one over-the-air adapter that is connected to the signal generation unit wherein the over-the-air adapter is configured to adapt the downlink signal to be transmitted such that the over-the-air transmission channel is equalized. Further, a method for testing a device under test is described.

17 Claims, 2 Drawing Sheets

(51) Int. Cl.
  *H04B 17/10* (2015.01)
  *H04B 17/21* (2015.01)
  *G01V 3/08* (2006.01)
  *G01V 3/10* (2006.01)
  *G01V 3/12* (2006.01)
  *H04B 17/309* (2015.01)
  *G01R 31/319* (2006.01)
  *H04W 24/06* (2009.01)
  *H04B 7/06* (2006.01)
  *H04B 7/08* (2006.01)
  *G01V 3/24* (2006.01)
  *H04B 17/391* (2015.01)

(52) U.S. Cl.
  CPC ............... *G01V 3/102* (2013.01); *G01V 3/12* (2013.01); *H04B 17/104* (2015.01); *H04B 17/21* (2015.01); *H04B 17/309* (2015.01); *H04W 24/06* (2013.01); *G01V 3/24* (2013.01); *H04B 7/0691* (2013.01); *H04B 7/0874* (2013.01); *H04B 17/391* (2015.01); *Y02A 90/32* (2018.01); *Y02A 90/342* (2018.01)

(58) Field of Classification Search
  USPC .......... 324/64, 323, 347, 354, 357, 376, 437
  See application file for complete search history.

(56) References Cited

U.S. PATENT DOCUMENTS

| | | | |
|---|---|---|---|
| 2012/0123723 A1* | 5/2012 | El-Hassan | H04B 17/0085 702/108 |
| 2012/0149424 A1* | 6/2012 | Dawid | H04B 7/0877 455/522 |
| 2013/0303089 A1* | 11/2013 | Wang | H04W 24/06 455/67.12 |
| 2013/0315170 A1* | 11/2013 | Dawid | H04B 7/0877 370/329 |
| 2019/0342014 A1* | 11/2019 | Chapman | H04B 17/0085 |

* cited by examiner

RADIO TEST SYSTEM AND METHOD FOR TESTING A DEVICE UNDER TEST

FIELD OF THE DISCLOSURE

Embodiments of the present disclosure relate generally to a radio test system and a method for testing a device under test.

BACKGROUND

In the state of the art, mobile device tests and equivalent tests, for example tests on a multiple-in multiple-out system, are performed by using a test and measurement device that comprises a signal generation unit which generates a test signal forwarded to the device under test. Depending on the testing purpose, different setups are used for testing the device under test.

During the development and manufacturing of mobile devices, a mobile device, for instance a mobile phone, is tested while being connected via a conductive signal path, for instance a cable, with the test and measurement device ensuring an optimal connection. This setup enables the testing of maximum data rates of downlink signals, for instance. Accordingly, such a testing setup is typically chosen for mobile device protocol testing.

Despite this setup, non-conducted setups (without cable connection) are known for testing a device under test wherein the test and measurement device is established by a radio test system comprising a transmitter and a receiver while having at least one antenna. The wireless test setup ensures that a realistic testing environment is provided. However, the wireless test environment is problematic due to its sensitivity of the relative position of the device under test and the corresponding antenna of the radio test system. These sensitivity problems are caused by different distances between the antennas of the radio test system and the device under test, for example its antennas.

The tests performed with such a non-conducted setup typically target on certain parameters of the device under test such as Total Isotropic Sensitivity (TIS), for instance. During these non-conducted tests, also called over-the-air tests, the device under test is rotated. Alternatively or supplementary, the antennas of the radio test system are rotated. This ensures that the relative position of the device under test and the antennas alters in order to minimize the negative influence of the relative position on the measurements.

In addition, WO 2016/190944 A1 describes a method for testing a device under test in a wireless test environment by adapting the power level of the radio test system appropriately wherein the performance characteristics of the device under test have been determined previously. Thus, the power level is adapted in order to compensate signal path losses caused by the wireless test environment.

However, the performance characteristics have to be determined first. Moreover, the adaption of the power level only compensates power level losses whereas other influences of the wireless test environment are not taken into account that impair the testing with regard to a cable connection.

Thus, there is a need for a method and a radio test system enabling tests of a device under test within a wireless environment in an efficient manner wherein the tests performed correspond to conducted tests.

SUMMARY

Embodiments of the present disclosure provide a radio test system for testing a device under test, comprising:

a signal generation unit configured to generate a downlink signal to be transmitted to the device under test for over-the-air testing;

at least one antenna configured to transmit the downlink signal via an over-the-air transmission channel to the device under test;

a receiver configured to receive a response signal via the over-the-air transmission channel from the device under test; and at least one over-the-air adapter that is connected to the signal generation unit, wherein the over-the-air adapter is configured to adapt the downlink signal to be transmitted such that the over-the-air transmission channel is equalized.

Accordingly, an optimal connection can be established by changing the characteristics of the test setup by adapting the downlink signal generated appropriately while passing the over-the-air adapter. The adaption of the downlink signal generated is done by the over-the-air adapter. Due to the adaption, it is possible to provide an optimal connection being similar to a cable connection even though the tests are performed over-the-air, namely wireless. Thus, the device under test can be tested in a non-conducted setup which means without any cable connection. As an optimal connection can be established, it is possible to test maximum data rates over-the-air, for instance as part of a protocol testing. The antenna and the signal generation unit form a transmitter that transmits the appropriate test signals, for example the downlink signals. As the over-the-air adapter is configured to simulate a base station, the transmitter and the over-the-air adapter form a base station emulator. As the downlink signal generated is adapted by the over-the-air adapter, the relative position between the device under test and the transmitter, for example its antenna, is not essential for obtaining an optimal connection. Furthermore, the radio test system ensures that the optimal over-the-air transmission channel is reproducible such that several tests can be performed each ensuring best and defined characteristics of the over-the-air transmission channel. In general, deterministic protocol tests can be performed by using the radio test system.

In some embodiments, multiple-in multiple-out systems (MIMO systems) can be tested by the radio test system, for example MIMO systems using spatial multiplexing.

According to an aspect, the radio test system comprises a control and analyzing unit configured to determine the over-the-air transmission channel, for example wherein input data for determining the over-the-air transmission channel is obtained over-the-air. The over-the-air transmission channel is established between the device under test and the radio test system, for example its receiver and its transmitter. The control and analyzing unit is configured to mathematically determine its characteristics. First, the characteristics of the over-the-air transmission channel are measured wherein the measurement results are forwarded to the control and analyzing unit.

The measurements can be done over-the-air as the radio test system receives appropriate response signals from the device under test over-the-air. As the input data for determining the over-the-air transmission channel is obtained over-the-air during the test, no cable connection is required. The input data obtained over-the-air mainly consists of the data related to the response signal received via the receiver. Further, the transmission data relating to the downlink signal(s) transmitted is used for determining the over-the-air transmission channel.

According to another aspect, the over-the-air transmission channel is mathematically defined by a channel matrix. The over-the-air adapter is configured to adapt the downlink signal to be transmitted by using the data related to the channel matrix, for example the measurement results. The channel matrix, also called H matrix, is determined by using the input data received mainly over-the-air via the receiver. In addition, the transmission data related to the downlink signals can be used for determining the channel matrix that mathematically described the over-the-air transmission channel. Accordingly, the channel matrix can be determined appropriately by using the control and analyzing unit. The channel matrix determined can be used for further processing, for example for adapting the downlink signal to be transmitted such that the over-the-air transmission channel can be equalized in order to provide an optimal wireless connection being similar to a cable connection.

In some embodiments, the over-the-air adapter is configured to adapt the downlink signal to be transmitted by applying an adaption matrix such that the matrix product of adaption matrix and channel matrix yields an identity matrix, for example to provide a left inverse of the channel matrix. The control and analyzing unit determines the adaption matrix based upon the channel matrix determined previously. Accordingly, the data obtained over-the-air is used for adapting the downlink signal appropriately such that an optimal connection is obtained being similar to a cable connection. The channel matrix determined previously is equalized accordingly while adapting the downlink signal by applying the adaption matrix. The adaption matrix applied corresponds to the left inverse of the channel matrix. The left inverse of the channel matrix may be obtained by using the Gaussian elimination or the adjugate of the channel matrix.

In addition, the radio test system may comprise an antenna array having several antennas wherein a control unit is configured to control the several antennas such that the number of active antennas at least simplifies the determination of a left inverse of the channel matrix. As the antenna array has several transmission antennas, for example antennas controlled to act as transmission antennas, the robustness of the radio test system is improved. In addition, the control unit is configured to control the antenna array such that the number of transmission and/or receiving antennas is increased if the channel matrix determined cannot be inverted in order to calculate its left inverse. The rank of a channel matrix can be increased while using "n" additional antennas. For instance, the testing of a MIMO system with N×M antennas results in a channel matrix having a rank of "N+n" while switching on the "n" additional antennas. Thus, the determination of the left inverse of the channel matrix is simplified. In addition, the usage of additional antennas may enable the determination of the left inverse.

Another aspect provides that the radio test system comprises a simulation unit configured to simulate an application and/or testing environment of the device under test. Therefore, certain test scenarios can be tested. The downlink signal is adapted by the simulation unit appropriately. Alternatively, the signal generation unit is part of the simulation unit such that the downlink signal is generated in an appropriate manner. The downlink signal forwarded to the over-the-air adapter corresponds to the desired application and/or testing environment.

Furthermore, the radio test system may comprise at least one of a beam forming unit and a fading unit, for example wherein the simulation unit comprises the beam forming unit and/or the fading unit. Accordingly, fading profiles, handover scenarios as well as beam forming can be tested. The downlink signals are modulated appropriately by the dedicated units. The beam forming unit and the fading unit may be part of the simulation unit such that the downlink signal provided relates to such a scenario being simulated.

According to an embodiment, the radio test system comprises at least one antenna that is configured to receive the response signal, for example wherein the at least one antenna configured to transmit the downlink signal generated is further configured to receive the response signal. Thus, the receiver comprises at least one antenna configured to receive the response signal. Generally, the antennas of the radio test system can be configured to transmit or receive signals depending on control signals. For instance, the over-the-air transmission channel, for example the channel matrix, is obtained by time division duplex and/or frequency division duplex techniques.

The radio test system may comprise at least one of a multiple-in multiple-out transmitter and a multiple-in multiple-out receiver, for example wherein the signal generation unit is part of the multiple-in multiple-out transmitter and/or wherein the multiple-in multiple-out receiver comprises an over-the-air adapter unit. This simplifies the testing of multiple-in multiple-out (MIMO) systems. In addition, the robustness of the radio test system is increased while using several antennas.

The downlink signals transmitted via the MIMO transmitter can be adapted appropriately due to its over-the-air adapter unit.

According to another aspect, the radio test system comprises a chamber for accommodating the device under test, for example wherein the chamber is an anechoic chamber and/or a reverberation chamber. Any interfering signals influencing the testing can be excluded such that optimal testing conditions are ensured. The electromagnetic reverberation chamber enables electromagnetic compatibility testing (EMC testing).

Further, embodiments of the present disclosure provide a method for testing a device under test with the following steps:

generating a downlink signal to be transmitted via a transmitter;

transmitting the downlink signal via at least one antenna of the transmitter to the device under test via an over-the-air transmission channel;

measuring the over-the-air transmission channel; and adapting the downlink signal by using an over-the-air adapter such that an ideal over-the-air transmission channel with respect to the transmission properties is provided.

The downlink behavior of the device under test is tested while performing the method mentioned above. The ideal over-the-air transmission channel obtained corresponds to a cable connection. Accordingly, a non-conducted setup is used that provides characteristics similar to a conducted setup. The downlink signal generated is adapted such that an adapted downlink signal is transmitted via the over-the-air transmission channel over-the-air. The over-the-air transmission channel is established between the device under test to be tested and a radio test system, for example its transmitter. As optimal transmission characteristics are ensured, maximum data rates of downlink signals can be tested. Hence, protocol testing can be performed appropriately.

According to an aspect, a channel matrix of the over-the-air transmission channel is determined, for example wherein input data for determining the channel matrix is obtained over-the-air. The radio test system may also comprise a receiver that receives response signals from the device under test. Hence, the channel matrix of the over-the-air transmission channel can be calculated by using inter alia the input data received over-the-air, for example via the receiver of the radio test system.

According to another aspect, a left inverse of the channel matrix determined is calculated to be used by the over-the-air adapter wherein the over-the-air adapter applies the adaption matrix to the downlink signal to be transmitted. The adaption matrix applied to the downlink signal ensures that the over-the-air transmission channel is equalized. The adaption matrix applied on the downlink signal to be transmitted corresponds to the left inverse of the channel matrix. Hence, it is ensured that the adapted over-the-air transmission channel can be described by an identity matrix. Therefore, ideal transmission characteristics are provided. The adapted over-the-air transmission channel is established between the radio test system and the device under test while transmitting the adapted downlink signal. The adaption of the downlink signal results in the adapted over-the-air transmission channel that can be described by the identity matrix due to applying the adaption matrix being the left inverse of the channel matrix. Thus, an optimal connection is provided even though a non-conducted setup is used.

The channel matrix of the over-the-air transmission channel may be determined first. Then, the left-inverse of this channel matrix is calculated such that the downlink signal to be transmitted is adapted appropriately. Due to the adaption of the downlink signal, the original over-the-air transmission channel is adjusted which results in an adapted over-the-air transmission channel while transmitting the adapted downlink signal. The adapted over-the-air transmission channel has an adapted channel matrix that corresponds to the identity matrix. The downlink signal is adapted by applying the left inverse of the original channel matrix such that the matrix product of the left inverse of the original channel matrix and the channel matrix yields to the identity matrix (corresponding to the adapted over-the-air transmission channel).

In some embodiments, the number of transmission and/or receiving antennas is increased if the channel matrix determined is not invertible. In case that the channel matrix of the over-the-air transmission channel cannot be inverted, the rank of the channel matrix is increased in order to enable inverting the channel matrix appropriately. For this purpose, additional antennas of an antenna array being part of the radio test system are switched on in order to increase the rank of the channel matrix. This also simplifies the calculation while reducing the computational power needed.

Furthermore, a device under test may be provided being static during the testing. The device under test is not rotated during testing. The antennas of the radio test system are also static. Thus, the relative position of the antenna of the radio test system and the device under test is maintained during testing. The relative position does not have any influence on the measurements as the over-the-air transmission channel is adjusted by applying the adaption matrix.

In general, the over-the-air transmission channel established between the device under test and the radio test system may be measured over-the-air since the receiver receives a response signal from the device under test.

The control and analyzing unit may be configured to determine the over-the-air transmission channel being mathematically defined by a channel matrix.

Further, the control and analyzing unit may have access to the signals transmitted and received in order to retrieve input data being necessary for determining the channel matrix.

The over-the-air adapter may be configured to adapt the downlink signal to be transmitted by using the data related to the channel matrix such that the over-the-air transmission channel is equalized.

The equalized over-the-air transmission channel corresponds to an ideal over-the-air transmission channel with respect to the transmission properties.

The simulation unit is configured to simulate an application and/or testing environment of the device under test.

Accordingly, the whole radio test system is configured to test the device under test with regard to a certain application and/or testing environment of the device under test simulated wherein the over-the-air transmission channel is equalized previously.

The equalization of the over-the-air transmission channel ensures that channel errors are minimized which might occur due to a different positioning of the device under test with respect to the radio test system. In contrast thereto, a pre-coder aims to minimize the error in the receiver output. Accordingly, the equalization of the over-the-air transmission channel is different to a pre-coding.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
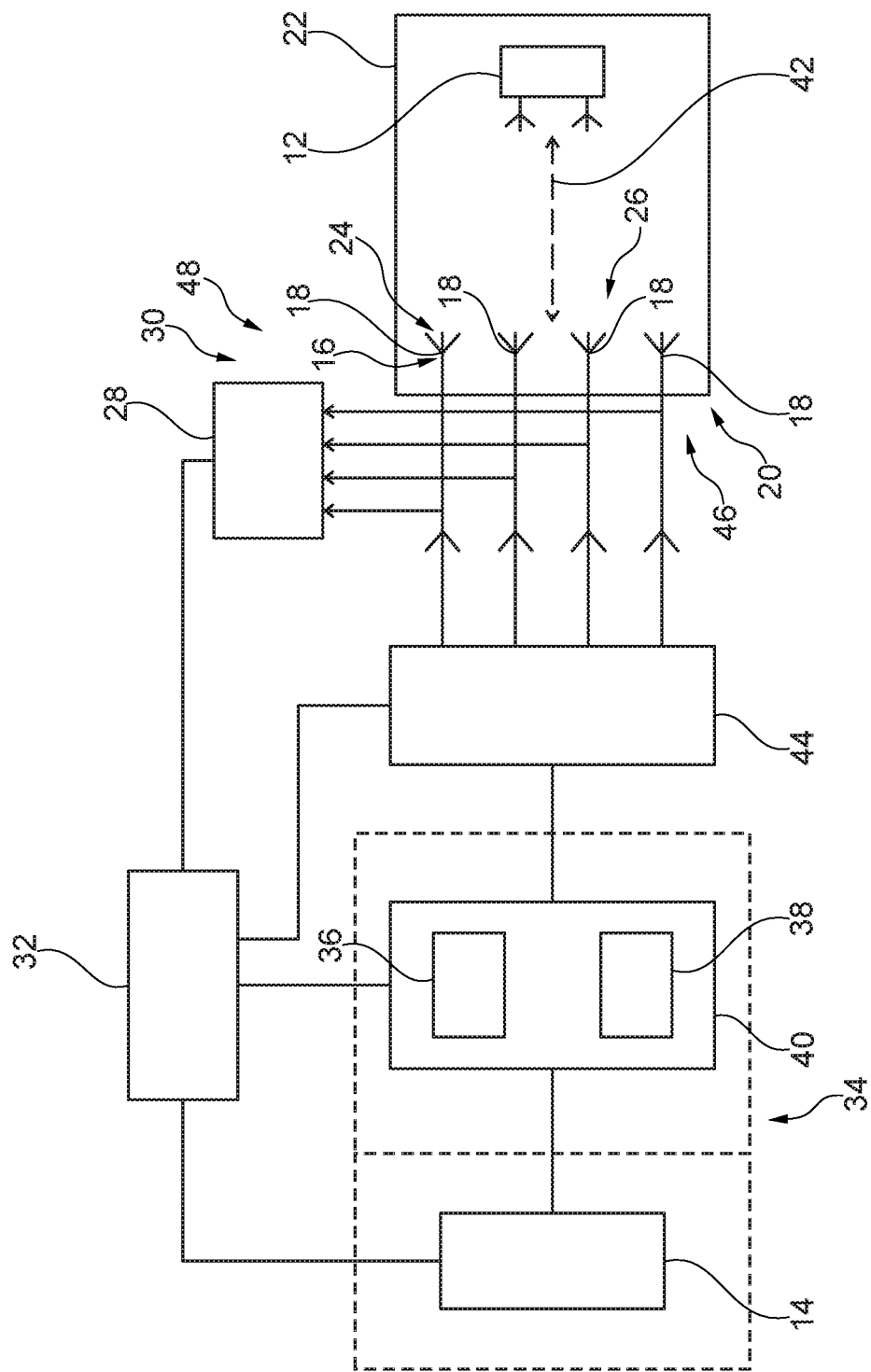
FIG. 1 schematically shows a radio test system according to an embodiment of the present disclosure.

In FIG. 1, a radio test system 10 is shown that is used for testing a device under test 12, for instance a mobile device such as a mobile phone. The radio test system 10 can be used for protocol testing. In the embodiment shown, the radio test system 10 comprises a signal generation unit 14 that is configured to generate a downlink signal used for testing purposes, for instance downlink signals having a frequency of about 28 GHz. Further, the radio test system 10 has an antenna array 16 that comprises several antennas 18.

The signal generation unit 14 is connected to the antenna array 16 such that the downlink signal generated can be transmitted via the antenna array 16, for example at least one of the several antennas 18. Accordingly, the signal generation unit 14 and at least one of the several antennas 18 define a transmitter 20 for transmitting the downlink signal generated over-the-air.

The antennas 18 are allocated to a chamber 22 being part of the radio test system 10 wherein the chamber 22 accommodates the device under test 12 during testing. The chamber 22 may be an anechoic chamber and/or an electromagnetic reverberation chamber in order to suppress or avoid disturbing interferences during the testing of the device under test 12.

As mentioned above, the antennas 18 can be used as transmission antennas 24 in order to transmit the downlink signal generated by the signal generation unit 14. However, the antennas 18 can also be used as receiving antennas 26 for receiving a response signal provided by the device under test 12. Accordingly, the radio test system 10 comprises at least one antenna 18 that is configured to receive the response signal of the device under test 12 wherein this antenna 18 is further configured to transmit the downlink signal. Thus, the same antenna 18 can be used as transmission antenna 24 and receiving antenna 26.

The response signal received by the respective antennas 18 is forwarded to a receiving unit 28 of the radio test system 10 wherein the receiving unit 28 and the respective antennas 18, for example the receiving antennas 26, form a receiver 30 of the radio test system 10.

The radio test system 10 also comprises a control and analyzing unit 32 that is connected to the signal generation unit 12 and the receiving unit 28 such that the response signal received can be analyzed by the control and analyzing unit 32. The control and analyzing unit 32 may control the signal generation appropriately, for example in response to the response signal received after its analysis.

Furthermore, the control and analyzing unit 32 is connected to a simulation unit 34 that is configured to simulate application and/or testing environments of the device under test 12 while adapting the downlink signal generated appropriately. The adaption of the downlink signal generated may be done by modulating the downlink signal.

In the shown embodiment, the simulation unit 34 comprises a beam forming unit 36 and a fading unit 38. Accordingly, the characteristics of the downlink signals transmitted via the antennas 18 can be adjusted by the simulation unit 34 in order to test handover scenarios, fading profiles and beam forming properties. In some embodiments, the downlink signal generated may be modulated by the beam forming unit 36 and the fading unit 38.

In some embodiments, the signal generation unit 14 may be part of the simulation unit 34. Thus, the downlink signals are already generated in the desired manner in order to test the specific testing and/or application environments. Alternatively, the beam forming unit 36 and the fading unit 38 are part of a modulation unit 40 such that beam forming and fading occur effectively.

As already mentioned, the downlink signal generated is transmitted via the antennas 18 of the antenna array 16 towards the device under test 12 that in turn transmits response signals which are received by the antennas 18. Generally, the response signals may correspond to uplink signals of the device under test 12.

Accordingly, an over-the-air transmission channel 42 is established between the device under test 12 and the radio test system 10, for example its antennas 18. This over-the-air transmission channel 42 is also named H-channel. The characteristics of the over-the-air transmission channel 42 can be mathematically described by a channel matrix. For instance, the channel matrix is determined by the control and analyzing unit 32 having access to the signals transmitted and received in order to retrieve input data being necessary for determining the channel matrix.

Figure 2:
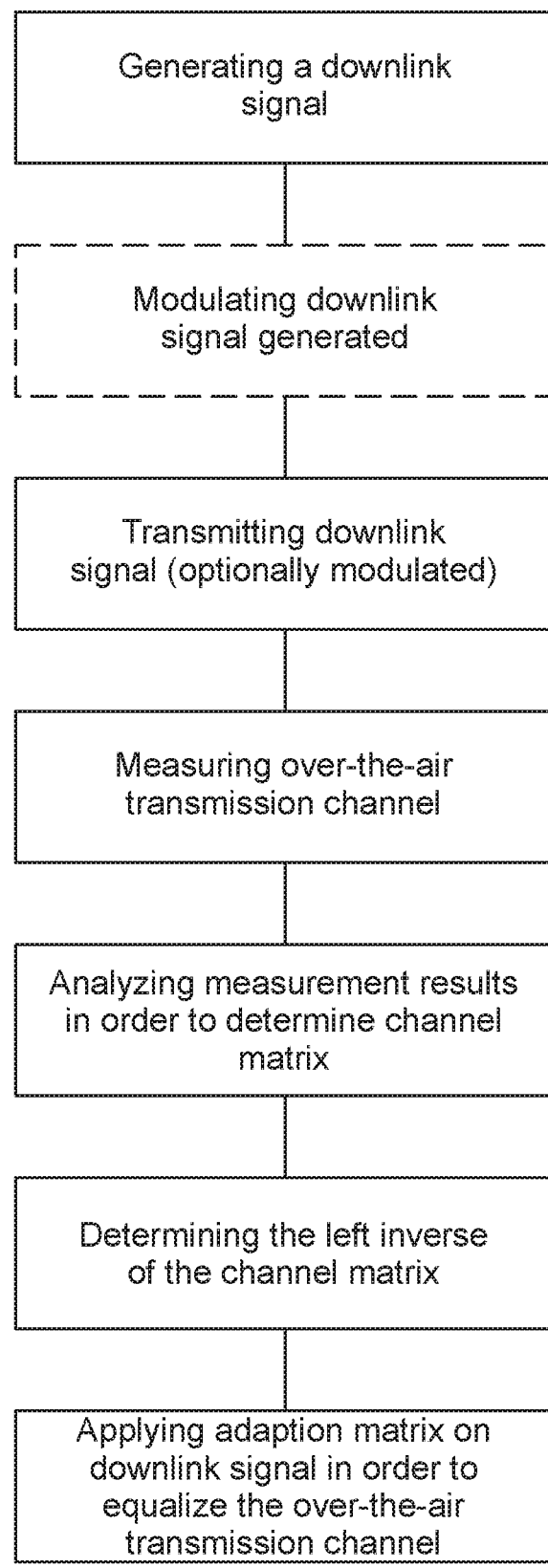
FIG. 2 shows a flow-chart representing a method for testing a device under test according to an embodiment of the present disclosure.

The radio test system 10 in some embodiments further comprises an over-the-air adapter 44 that is configured to adapt the downlink signal to be transmitted in an appropriate manner in order to equalize the over-the-air transmission channel 42 such that an optimal connection is established as will be described hereinafter while also referring to FIG. 2.

First, a downlink signal is generated by the signal generation unit 14 wherein the downlink signal generated is transmitted to the device under test 12 via the antenna array 14, for example the antennas 18 used as transmission antennas 24. Previously, the downlink signal generated may be adapted by the simulation unit 34 or the modulation unit 40 in order to apply a certain testing and/or application environment. Then, the (optionally modulated) downlink signal is forwarded to the antenna array 16 of the radio test system 10.

The transmitted downlink signal is received by the device under test 12 that in turn transmits a response signal (uplink signal) that is received by the antennas 18, for example the receiving antennas 26. The received response signal is forwarded to the receiving unit 28 that may pre-process the response signal appropriately. Afterwards, the response signal or the data related thereto is forwarded to the control and analyzing unit 32 for analyzing purposes.

Then, the control and analyzing unit 32 determines the channel matrix describing the over-the-air transmission channel 42 mathematically. Thus, the control and analyzing unit 32 obtains the input data required for determining the channel matrix over-the-air as the radio test system 10 receives the response signal over-the-air being at least part of the input data required for determining the channel matrix.

The information of the over-the-air transmission channel 42, for example the input data received, may relate to time division duplex (TDD) signals that can be used to estimate the channels of uplink signal transmissions and/or frequency division duplex (FDD) while requesting and receiving reports of the device under test 12 that are analyzed appropriately.

Once the channel matrix has been determined, the control and analyzing unit 32 determines a left inverse of the channel matrix in order to equalize the over-the-air transmission channel. The equalizing step is done by applying an adaption matrix on the downlink signal to be transmitted while passing the over-the-air adapter 44. The adaption matrix corresponds to the left inverse calculated such that the matrix product of the adaption matrix and the original channel matrix is the identity matrix. The control and analyzing unit 32 controls the over-the-air adapter 44 appropriately.

Hence, the downlink signal generated passing the over-the-air adapter 44 is adapted appropriately by applying the adaption matrix. The adapted over-the-air transmission channel is established by the original over-the-air transmission channel while transmitting the adapted downlink signal.

While adapting the downlink signal appropriately, it is ensured that the original over-the-air transmission channel 42 is equalized.

Accordingly, the downlink signal generated is transmitted such that an optimal wireless (over-the-air) connection is provided that corresponds to a conducted connection established by a cable.

The downlink signal to be transmitted is adapted or adjusted such that the influences and disturbances of the over-the-air transmission channel being indicated by the respective channel matrix are pre-compensated. Hence, the pre-compensation and the influences and disturbances cancel each other out such that an ideal connection is provided. Accordingly, the originally generated downlink signal that has been modulated optionally reaches the device under test 12 in an ideal manner being similar to a cable connection.

In some embodiments, the transmitter 20 and the receiver 30 may be formed by a multiple-in multiple-out transmitter 46 (MIMO transmitter) and a multiple-in multiple-out receiver 48 (MIMO receiver), respectively. Thus, MIMO systems can be tested appropriately by using the radio test system 10.

In the shown embodiment, the MIMO transmitter 46 and the MIMO receiver 48 each have four antennas 18 wherein the antennas 18 are controlled to act as transmission and/or receiving antennas. The antennas 18 may be controlled by the control and analyzing unit 32 in an appropriate manner.

Further, the MIMO transmitter 46 and the MIMO receiver 48 both are allocated to over-the-air adapter units. As already described, the MIMO transmitter 46 is allocated to the over-the-air adapter 44 itself whereas the MIMO receiver 48 may have an integrated over-the-air adapter unit.

Moreover, the signal generation unit 12 can be established as a part of the MIMO transmitter 46. Accordingly, the MIMO transmitter 46 may also comprise the simulation unit 34 and/or the modulation unit 40.

In general, the robustness of the radio test system 10 increases with the number of antennas 18 used. Further, the antenna array 16 may comprise more antennas 18 as the device under test 12 such that additional antennas can be used for determining the channel matrix, for example determining its left inverse. Accordingly, additional antennas 18 are switched on for testing provided that it is not possible to determine the left inverse of the channel matrix being required for adapting the downlink signal appropriately. The left inverse is required to equalize the over-the-air transmission channel.

For instance, "n" additional antennas are switched on for testing a MIMO system having "N" antennas. Hence, the rank of the over-the-air transmission channel is "N+n" which simplifies the determination of a left inverse of the channel matrix significantly.

In general, the adaption of the downlink signal by applying the adaption matrix results in a compensation of the disturbances and interferences that occur due to the wireless transmission of the downlink signals. Due to their compensation, an optimal connection is provided that corresponds to a cable connection even though a non-conducted test setup is used.

The equalized over-the-air transmission channel corresponds to the adapted over-the-air transmission channel while applying the adaption matrix on the downlink signal. Accordingly, the over-the-air transmission channel is the original one that has been measured previously in order to determine the channel matrix used for calculating its left inverse.

In other words, the adapted over-the-air transmission channel is the original over-the-air transmission channel wherein the adapted downlink signal is transmitted via the original over-the-air transmission channel. As the adapted downlink signal is adapted by applying the adaption matrix, the adapted over-the-air transmission channel corresponds to the matrix product of the adaption matrix and the channel matrix of the over-the-air transmission channel. As the adaption matrix corresponds to the left inverse of the channel matrix, the adapted channel matrix of the adapted over-the-air transmission channel corresponds to the identity matrix.

Accordingly, a radio test system 10 and a method for testing a device under test 12 are provided that ensure optimal characteristics being similar to a conducted test setup even though the device under test 12 is tested over-the-air.

Components of the system 10, including the control and analyzing unit 32, may include, in some embodiments, logic for implementing the technologies and methodologies described herein. This logic can be carried out in either hardware or software, or a combination of hardware and software.

In some embodiments, the control and analyzing unit 32 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, memory elements, or combinations thereof. In an embodiment, the control and analyzing unit 32 includes a microprocessor and a memory storing logic modules and/or instructions. In an embodiment, the control and analyzing unit 32 includes one or more ASICs having a plurality of predefined logic components. In an embodiment, the control and analyzing unit 32 includes one or more FPGA having a plurality of programmable logic components. In an embodiment, the control and analyzing unit 32 includes hardware circuit implementations (e.g., implementations in analog circuitry, implementations in digital circuitry, and the like, and combinations thereof). In an embodiment, the control and analyzing unit 32 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A radio test system for testing a device under test, comprising:
    a signal generation unit configured to generate a downlink signal to be transmitted to the device under test for over-the-air testing;
    at least one antenna configured to transmit the downlink signal via an over-the-air transmission channel to the device under test, wherein the over-the-air transmission channel is mathematically defined by a channel matrix;
    a receiver configured to receive a response signal via the over-the-air transmission channel from the device under test; and
    at least one over-the-air adapter that is connected to the signal generation unit, the over-the-air adapter being configured to adapt the downlink signal to be transmitted such that the over-the-air transmission channel is equalized; and an antenna array having several antennas, a control unit being configured to control the several antennas such that the number of active antennas at least simplifies the determination of a left inverse of the channel matrix.

2. The radio test system according to claim 1, wherein the radio test system comprises a control and analyzing unit configured to determine the over-the-air transmission channel.

3. The radio test system according to claim 2, wherein input data for determining the over-the-air transmission channel is obtained over-the-air.

4. The radio test system according to claim 1, wherein the over-the-air adapter is configured to adapt the downlink signal to be transmitted by applying an adaption matrix such that the matrix product of adaption matrix and channel matrix yields an identity matrix.

5. The radio test system according to claim 4, wherein the adaption matrix is a left inverse of the channel matrix.

6. The radio test system according to claim 1, wherein the radio test system comprises a simulation unit configured to simulate at least one of an application environment and a testing environment of the device under test.

7. The radio test system according to claim 1, wherein the radio test system comprises at least one of a beam forming unit and a fading unit.

8. The radio test system according to claim 6, wherein, the simulation unit comprises at least one of the beam forming unit and the fading unit.

9. The radio test system according to claim 1, wherein the radio test system comprises at least one antenna that is configured to receive the response signal.

10. The radio test system according to claim 9, wherein the at least one antenna configured to transmit the downlink signal generated is further configured to receive the response signal.

11. The radio test system according to claim 1, wherein the radio test system comprises at least one of a multiple-in multiple-out transmitter and a multiple-in multiple-out receiver.

12. The radio test system according to claim 1, wherein the radio test system comprises a chamber for accommodating the device under test.

13. A method for testing a device under test with the following steps:
generating a downlink signal to be transmitted via a transmitter;
transmitting the downlink signal via at least one antenna of the transmitter to the device under test via an over-the-air transmission channel;
measuring the over-the-air transmission channel; and
adapting the downlink signal by using an over-the-air adapter such that an ideal over-the-air transmission channel with respect to the transmission properties is provided,
wherein a channel matrix of the over-the-air transmission channel is determined, and
wherein the number of at least one of the transmission and receiving antennas is increased if the channel matrix determined is not invertible.

14. The method according to claim 13, wherein a left inverse of the channel matrix determined is calculated to be used by the over-the-air adapter, the over-the-air adapter applying an adaption matrix to the downlink signal to be transmitted.

15. The method according to claim 13, wherein a device under test is provided being static during the testing.

16. The method according to claim 13, wherein at least one of an application environment and a testing environment of the device under test is simulated via a simulation unit.

17. A radio test system for testing a device under test, comprising:
a signal generation unit configured to generate a downlink signal to be transmitted to the device under test for over-the-air testing;
at least one antenna configured to transmit the downlink signal via an over-the-air transmission channel to the device under test;
a receiver configured to receive a response signal via the over-the-air transmission channel from the device under test so that the over-the-air transmission channel established between the device under test and the radio test system is measured over-the-air,
a control and analyzing unit configured to determine the over-the-air transmission channel being mathematically defined by a channel matrix, and wherein the control and analyzing unit has access to the signals transmitted and received in order to retrieve input data being necessary for determining the channel matrix;
at least one over-the-air adapter that is connected to the signal generation unit,
the over-the-air adapter being configured to adapt the downlink signal to be transmitted by using the data related to the channel matrix such that the over-the-air transmission channel is equalized; and
a simulation unit configured to simulate at least one of an application and a testing environment of the device under test.

* * * * *